(12) United States Patent
Zhuang et al.

(10) Patent No.: US 8,014,480 B1
(45) Date of Patent: Sep. 6, 2011

(54) ZERO-DELAY SERIAL COMMUNICATIONS CIRCUITRY FOR SERIAL INTERCONNECTS

(75) Inventors: Jingcheng Zhuang, Dallas, TX (US); Qingjin Du, Dallas, TX (US); Tad Kwasniewski, Ottawa (CA); Rakesh H. Patel, Cupertino, CA (US)

(73) Assignee: Altera Corporation, San Jose, CA (US)

( * ) Notice: Subject to any disclaimer, the term of this patent is extended or adjusted under 35 U.S.C. 154(b) by 1046 days.

(21) Appl. No.: 11/716,229

(22) Filed: Mar. 9, 2007

(51) Int. Cl.
*H04L 7/00* (2006.01)

(52) U.S. Cl. ........ 375/355; 375/306; 375/316; 375/342; 375/343; 375/350; 370/516

(58) Field of Classification Search .................. 375/250, 375/259, 260, 292, 295, 299, 306, 316, 355, 375/354, 359, 360, 371, 322, 342, 346; 370/324, 370/516

See application file for complete search history.

(56) References Cited

U.S. PATENT DOCUMENTS

| | | | |
|---|---|---|---|
| 5,151,623 A | 9/1992 | Agrawal | |
| 5,809,261 A | 9/1998 | Lambrecht | |
| 6,317,804 B1 | 11/2001 | Levy et al. | |
| 6,545,507 B1 | 4/2003 | Goller | |
| 7,084,664 B1 | 8/2006 | Lee et al. | |
| 7,127,133 B2 | 10/2006 | Manderscheid et al. | |
| 7,142,740 B2 | 11/2006 | Lee et al. | |
| 7,586,955 B2 * | 9/2009 | Iizuka | 370/516 |
| 2002/0085655 A1 * | 7/2002 | Johnson | 375/354 |
| 2003/0095619 A1 * | 5/2003 | Vallet et al. | 375/355 |
| 2004/0165679 A1 * | 8/2004 | Kwak | 375/316 |
| 2005/0193045 A1 * | 9/2005 | Yamamoto et al. | 708/250 |
| 2005/0268149 A1 * | 12/2005 | Sherlock | 714/2 |
| 2007/0248201 A1 * | 10/2007 | Ker et al. | 375/355 |

* cited by examiner

*Primary Examiner* — Shuwang Liu
*Assistant Examiner* — Hirdepal Singh
(74) *Attorney, Agent, or Firm* — Treyz Law Group; G. Victor Treyz; David C. Kellogg

(57) ABSTRACT

Circuitry and methods for supporting serial communications over serial interconnects between circuit modules are provided. A data recovery circuit receives incoming serial data from the serial interconnect path with zero delay. The data recovery circuit includes a data sampler that samples the incoming serial data using a multiphase clock. Data samples are provided to a multiplexer that selects an optimum sampled data signal to use as a recovered data signal. The multiplexer has a control input that receives a phase pointer signal. Control circuitry in the data recovery circuit analyzes the sampled data signals and a current value of the phase pointer to compute a clock phase shift error. If the clock phase shift error exceeds a predetermined value, the phase pointer signal can be updated. The data recovery circuit may be implemented using hardwired circuitry or programmable logic.

18 Claims, 10 Drawing Sheets

ZERO-DELAY SERIAL COMMUNICATIONS CIRCUITRY FOR SERIAL INTERCONNECTS

BACKGROUND

This invention relates to communications circuitry, and more particularly, to serial communications circuitry used in conveying signals over circuit interconnects.

Integrated circuits contain various regions of circuitry. Metal lines called interconnects are used to convey signals between these different circuit regions.

It has recently become apparent that conventional circuit designs cannot simply be scaled up in size indefinitely. For example, microprocessor designers have begun to explore multi-core architectures as an alternative to constructing ever-larger microprocessor chips. Particularly in designs such as these, large numbers of signals need to be conveyed from one portion of an integrated circuit to another.

Large numbers of signals also need to be conveyed between blocks of circuitry on integrated circuits such as programmable logic device integrated circuits. In modern programmable logic device integrated circuit, circuit blocks no longer all perform identical functions. Memory blocks are used for data storage, digital signal processing blocks are used for specialized data processing functions, and programmable logic blocks are used for user logic. The broad range of functions that are implemented in the circuit blocks can place a burden on the interconnect infrastructure. Modern programmable logic device integrated circuits also tend to have circuit blocks that are larger and more complex than older devices, which further burdens the interconnects.

In a typical programmable logic device, rows and columns of interconnects are selectively coupled to each other using programmable switches at row and column intersections. Because of the custom nature of programmable logic device integrated circuits, programmable logic device integrated circuits may need to have several times as many interconnects as comparable custom logic circuits. Programmable logic device integrated circuits may therefore be particularly sensitive to interconnect inefficiencies.

One way to ensure that a given programmable logic device integrated circuit has sufficient interconnect resources to implement a desired circuit design is to over-provision the interconnect fabric. By providing many interconnects, logic designers are ensured that their designs can be implemented without exhausting available interconnect resources. However, as the number of interconnects that are included on an integrated circuit increases, the size of the integrated circuit increases. This, in turn, makes the distances between circuit blocks on the integrated circuit larger and creates new interconnect challenges.

There is therefore a need for improved integrated circuit interconnect structures.

SUMMARY

In accordance with the present invention, circuitry and methods for supporting communications over serial interconnects are provided.

Serial data may be conveyed between a first module and a second module over a serial interconnect structure. The modules may be circuit blocks within an integrated circuit such as a programmable logic device integrated circuit or may be integrated circuits on one or more circuit boards in a system. The serial interconnect structures may be formed from single-ended or differential signal paths.

In a transmitting module, programmable logic or other circuitry may generate data to be transmitted. Parallel data can be serialized using a serializer. Serial data is conveyed over the serial interconnect path and is received at a receiving circuit module.

The receiving circuit module has a data recovery circuit that receives incoming serial data and provides a corresponding recovered data stream to a deserializer. The deserializer converts the recovered data stream to parallel data for use by programmable logic or other circuitry in the receiving circuit module.

The data recovery circuit includes a data sampler that receives the incoming serial data stream. The data sampler includes a number of registers. The registers are clocked by respective clock phases in a multiphase clock signal. The data sampler provides a number of associated sampled data signals at its output.

A multiplexer receives each of the sampled data signals at its input. With one suitable arrangement, there are five clock phases in the multiphase clock, so there are five corresponding sampled versions of the serial data signal and five inputs to the multiplexer. The multiplexer has a control input that receives a phase pointer signal. The phase pointer signal controls the multiplexer. In response to the phase pointer signal, the multiplexer selects an optimum one of the sampled data signals to use as the recovered data signal.

Control circuitry in the data recovery circuit identifies which of the sampled data signals is the optimum data signal. The control circuitry may include a shift register in which the phase pointer signal is maintained.

A phase detector in the control circuitry receives the sampled data signals and a fed-back version of the phase pointer. The phase detector analyzes the sampled data signals to determine the location of the edge of the incoming serial data. Based on this information and information on the current location of the phase pointer, the phase detector generates left and right shift control signals. The left and right shift control signals are filtered using a low-pass filter implemented in a shift decision circuit. The filtered left and right shift control signals are applied to the shift register to update the pointer.

The control circuitry uses a non-linear control algorithm in determining whether or not to update the current value of the phase pointer. With one suitable approach, the control circuitry generates a clock phase shift error signal. The clock phase shift error signal indicates how much the current value of the phase pointer has become shifted (if at all) from its optimum value. If the incoming data drifts, the sampled data that is currently selected by the multiplexer will no longer be the optimum sampled data signal to use as the recovered data. The control circuit can detect this error and update the phase pointer to ensure that the appropriate sampled data stream is routed to the output of the multiplexer.

To ensure that the data recovery circuit exhibits good jitter tolerance, the control circuit preferably does not update the phase pointer unless the clock phase shift error reaches an appropriate threshold. With one suitable arrangement, the control circuit updates the current value of the phase pointer only when the clock phase shift error is at least two (i.e., when the relative phase shift is plus or minus two). Clock phase shift errors of plus or minus one and clock phase shift errors of zero will not result in an updating of the phase pointer.

The date recovery circuit may be implemented using hard-wired circuitry, programmable logic that has been configured with configuration data to perform data recovery circuit functions, or a combination of programmable logic and hardwired circuitry.

Further features of the invention, its nature and various advantages will be more apparent from the accompanying drawings and the following detailed description of the preferred embodiments.

DETAILED DESCRIPTION

The present invention relates to the use of serial interconnect architectures to relieve interconnect bottlenecks. Serial communications arrangements are used to transmit and receive signals over serial interconnects. The interconnects may be on-chip interconnects or may be interconnects on a circuit board or one or more other system components. For clarity, the present invention will generally be described in the context of on-chip serial interconnects.

The integrated circuits in which the serial interconnects are formed may be any suitable integrated circuits in which it is desired to convey large amounts of data from one circuit region to another. For example, the integrated circuits may be memory chips, digital signal processing circuits, microprocessors, application specific integrated circuits, programmable logic device integrated circuits and other programmable integrated circuits, or any other suitable integrated circuit. The desire to relieve interconnect bottlenecks can be particularly great in programmable logic devices, so the present invention will generally be described in the context of programmable logic device integrated circuits as an example.

Figure 1:
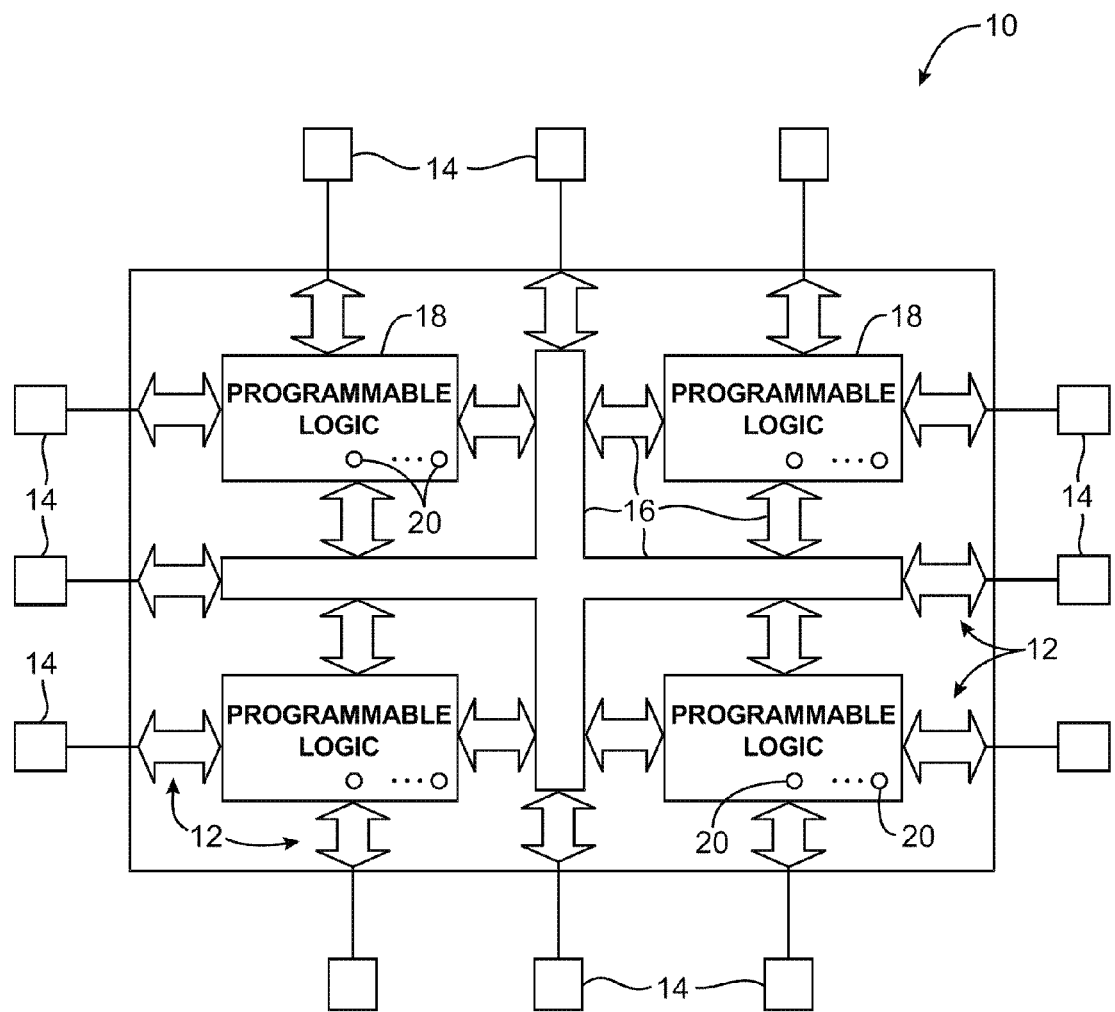
FIG. 1 is a diagram of an illustrative programmable logic device integrated circuit in accordance with the present invention.

An illustrative programmable logic device 10 in accordance with the present invention is shown in FIG. 1. Programmable logic device 10 may have input/output circuitry 12 for driving signals off of device 10 and for receiving signals from other devices via input/output pins 14.

Interconnects 16 such as global and local vertical and horizontal conductive lines may be used to route signals on device 10.

Programmable logic 18 may include combinational and sequential logic circuitry. The programmable logic 18 may be configured to perform a custom logic function. Programmable switches associated with the interconnection resources on device 10 may be considered to be a part of programmable logic 18.

Programmable logic device 10 contains programmable elements 20. Elements 20 can be programmed using configuration data. In general, elements 20 may be based on any suitable technology. With one suitable arrangement, elements 20 are formed form volatile memory such as random-access memory. With another suitable arrangement, elements 20 are formed from non-volatile structures such as programmable fuses, programmable antifuses, or programmable-read-only memory. In mask-programmed arrangements, groups of programmable via structures that are programmed using custom lithographic masks are used to form elements 20.

Most commonly, programmable elements 20 are formed from memory elements that can be loaded with configuration data (also called programming data) using pins 14 and input/output circuitry 12. Once loaded, the elements 20 each provide a corresponding static control output signal that controls the state of an associated logic component in programmable logic 18. The memory element output signals are typically applied to the gates of metal-oxide-semiconductor (MOS) transistors. These transistors may include n-channel metal-oxide-semiconductor (NMOS) pass transistors in programmable components such as multiplexers. Some of the output signals may also be used to control p-channel metal-oxide-semiconductor (PMOS) transistors (e.g., power-down transistors). By loading appropriate configuration data into the programmable elements 20, a logic designer can configure programmable logic device 10 to perform a desired custom logic function.

The circuitry of device 10 may be organized using any suitable architecture. As an example, the logic of programmable logic device 10 may be organized in a series of rows and columns of larger programmable logic regions each of which contains multiple smaller logic regions. The larger logic regions are sometimes referred to as logic array blocks. The smaller logic regions are sometimes referred to as logic elements. A typical logic element may contain a look-up table, registers, and programmable multiplexers. If desired, the logic of device 10 may be arranged in more levels or layers in which multiple large regions are interconnected to form still larger portions of logic. Still other device arrangements may use logic that is not arranged in rows and columns.

The logic resources of device 10 may be interconnected by interconnects 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement.

Interconnects 16 include fixed interconnects (conductive lines) and programmable interconnects (i.e., interconnects for which programmable connections can be made using programmable switches). Interconnects 16 typically include at least some groups of parallel lines, which are sometimes referred to as busses. In accordance with the present invention, at least some of the interconnects 16 also include serial interconnects. These serial interconnects may be operated at higher data rates than the parallel interconnects on the device 10, so that a relatively larger number of parallel interconnects can be replaced by a relatively smaller number of serial interconnects.

For example, in a device 10 in which parallel data is conveyed over parallel interconnects 16 at 500 Mbps (as an example), serial data can be conveyed at 40 Gbps (as an example). With this type of arrangement, 80 parallel interconnect lines can be replaced by a single serial interconnect line (or by a pair of serial lines if it is desired to use a differential signaling scheme for the serial path). This reduces the amount of real estate on the integrated circuit 10 that is devoted to interconnects and makes device 10 smaller and more efficient.

Programmable logic device integrated circuits contain blocks of programmable logic 18. Programmable logic device integrated circuits may also contain other types of resources, such as blocks of memory, digital signal processors, hardwired circuits (e.g., for handling communications functions or specialized computations), and other suitable blocks of circuitry. Serial interconnects can be used to connect any of these circuit blocks to each other. If desired, serial interconnects can also be used to interconnect resources on circuit boards or other resources in a system. As an example, serial interconnects can be used to connect a programmable logic device and a custom integrated circuit on a circuit board or may be used to interconnect a microprocessor on one board in a system with a microprocessor that is located on another board in the system.

Figure 2:
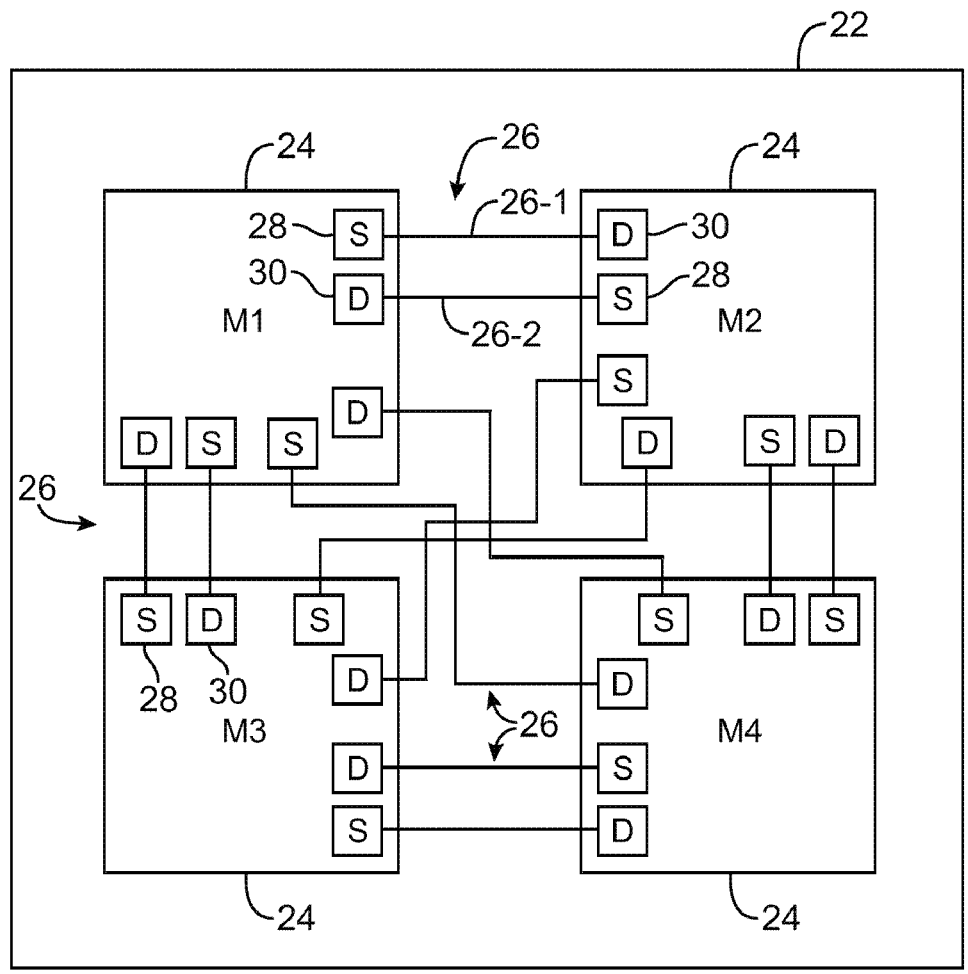
FIG. 2 is a diagram showing how circuit modules on an integrated circuit or in a system can be interconnected at least partly using serial interconnects in accordance with the present invention.

FIG. 2 shows illustrative circuitry 22 in which modules of circuitry 24 communicate at least partly using serial paths 26. The circuit modules 24 may be any suitable regions of circuitry. For example, modules 24 may be circuit blocks on a programmable integrated circuit 10 such as digital signal processing blocks, hardwired circuit blocks such as hardwired blocks of dedicated communications circuitry or circuitry for performing computationally-intensive calculations, memory blocks, or programmable logic blocks. As another example, modules 24 may be integrated circuits that are mounted on a single board or that are mounted on multiple boards or mounting structures in a larger system. These are merely illustrative arrangements. Modules 24 may be any suitable regions of circuitry in any suitable integrated circuit, circuit board, or system.

Circuit modules 24 may, if desired, communicate at least partly using parallel interconnects. Circuit modules 24 also communicate with each other over one or more serial paths 26. In a typical arrangement, circuitry within a module 24 generates data. The data may be generated in parallel form. For example, a number of logic elements or a hardwired block of circuitry may generate data on a 16-bit bus.

Modules 24 contain serializers 28 and deserializers 30 to transform parallel data to serial data and to transform serial data back into parallel form. When it is desired, as an example, to transmit data from module M1 to module M2, data that is generated in module M1 can be serialized using serializer 28 in module M1. The serial data is then conveyed to module M2 over serial interconnect 26-1. Serial paths 26 such as serial interconnect path 26-1 may be formed from a single line (when a single-ended signaling scheme is used in which data is referenced to ground) or may be formed from a pair of lines (when a differential signaling scheme is used in which data signals on the differential lines are referenced to each other). At module M2, the signals from path 26-1 are received and deserialized using deserializer 30 in module M2. The deserialization process converts serial data from path 26-1 into parallel data that may be used by the circuitry of module M2. The serializer circuitry 28 in module M2, path 26-2, and the deserializer circuitry 30 in module M1 may be used to convey data signals from module M2 to module M1.

If desired, there may be point-to-point serial data links between each module 24 in circuitry 22. For example, in an integrated circuit (or system) that contains four modules 24, there may be six bidirectional sets of serial paths 26, each of which handles point-to-point serial communications between a respective pair of the modules 24. In general, however, it is not necessary to interconnect each module 24 to every other module 24 in circuitry 22. Serial paths such as paths 26 can be deployed selectively as desired.

Although the example of FIG. 2 shows circuitry 22 that contains four modules 24, this is merely illustrative. Circuitry 22 can have any suitable number of modules 24. In systems with more modules 24, there may be more serial paths 26 (e.g., tens of paths 26, hundreds of paths 26, thousands of paths 26, etc.). Systems may also have fewer modules 24 and fewer paths 26 than the circuitry 22 of FIG. 2.

The number of paths 26 that are used on a given integrated circuit can be maintained at a reasonable level by increasing the size of modules 24 (i.e., by using serial paths 26 to connect relatively larger circuits such as complex blocks of logic rather than attempting to interconnect every logic element on an integrated circuit using a serial communications methodology).

A typical serializer 28 may be formed using an N:1 multiplexer. The N:1 multiplexer receives N data signals from an N-bit parallel data bus. The data signals may, as an example, have a data rate associated with a clock C1. The N:1 multiplexer is driven by a clock C2. The clock signal C2 may be equal to N*C1. In operation, the N:1 multiplexer systematically connects each of its inputs to its output at a rate associated with the clock signal C2. At the output of the multiplexer, an output buffer or other circuitry may be used to route the serialized data onto an interconnect path 26. The serialized data is transmitted over the path 26 to receiver circuitry in an appropriate receiving module 24 (e.g., a receiver and associated deserializer circuitry 30).

The N:1 multiplexer can be operated asynchronously, without concern for the state of the receiver in the receiving module 24. There are no complex serial communications protocols involved in transmitting data over interconnect paths 26, so circuitry in a given module 24 that generates data signals for another module 24 need not wait for a serial communications link to be established between the two modules. There is generally no delay imposed on outgoing serial data signals. Rather, data can be transmitted immediately, in the same clock cycle that it is generated or, to ensure that the data is stable before it is transmitted, in the next clock cycle.

During normal operation of the receiving circuitry in each module 24, data can be received within one clock cycle. As a result, there is essentially no delay associated with receiving incoming serial data. Incoming serial data is captured and deserialized rapidly for use by the circuitry in the receiving module.

The receiving circuitry in each module 24 contains a data recovery circuit that samples incoming data using a multiphase clock. Data samples corresponding to each clock phase of the multiphase clock are provided to a multiplexer. A phase pointer is used to control the multiplexer. The state of the phase pointer determines which of the sampled data signals from multiplexer's inputs is routed to the multiplexer's output.

Control circuitry in the data recovery circuit is used to continually update the phase pointer. Phase pointer updates are made based on an analysis of the current phase pointer state and the sampled data.

The control circuitry uses a non-linear control algorithm. The non-linear control algorithm responds quickly to changes in the incoming data signal while exhibiting good jitter tolerance.

Using the non-linear control algorithm, the control circuitry tracks the incoming data signal. An error signal is generated that represents the amount that the incoming data has been shifted in time. If the error signal indicates that the incoming data has drifted significantly (e.g., by plus or minus two clock phases), the phase pointer is shifted accordingly. If, however, the error signal indicates that the incoming data has changed only a relatively small amount (e.g., by plus or minus one clock phase), the phase pointer is not changed.

The control circuitry may use a count-down timer to ensure that phase pointer adjustments are not made too quickly. By restraining the speed at which the control circuitry adjusts the multiplexer control signal, the control circuitry implements a low-pass filter scheme. The low-pass filter scheme represents a form of signal averaging, which ensures that the control algorithm is stable and provides good data recovery performance.

Any suitable circuitry may be used to receive and deserialize incoming data. An illustrative data recovery circuit 32 that may be used to receive and deserialize incoming data for a module 24 is shown in FIG. 3.

Figure 3:
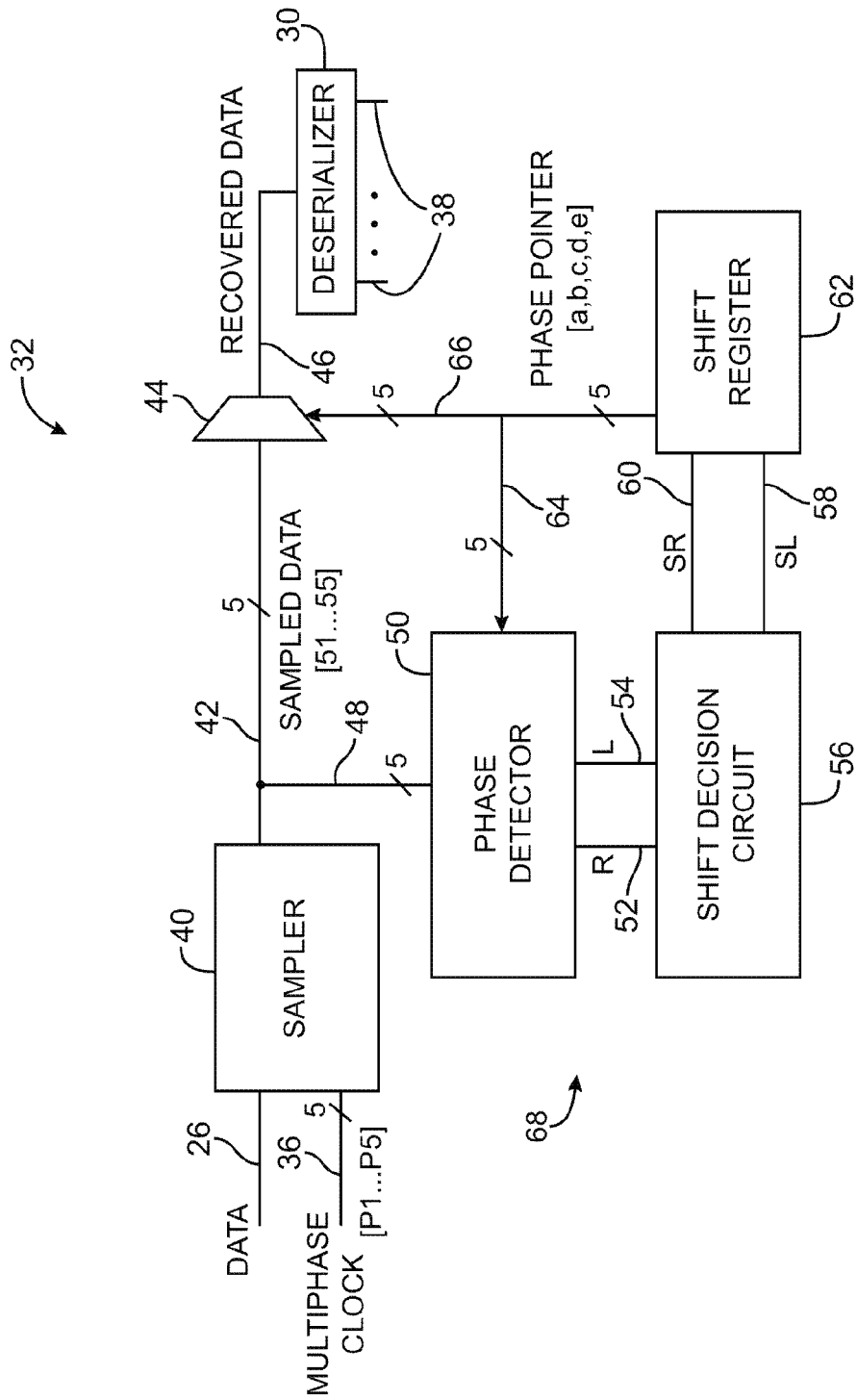
FIG. 3 is a diagram of an illustrative serial communications data recovery circuit that may be used in serial communications link receiver circuitry in accordance with the present invention.

Illustrative data recovery circuit 32 of FIG. 3 includes control circuitry 68. Control circuitry 68 includes a phase detector 50, shift decision circuit 56, and shift register 62. This is, however, merely one possible circuit implementation for data recovery circuit 32. Any suitable receiver circuitry that receives data with zero delay may be used for receiving circuitry in modules 24 if desired.

As shown in FIG. 3, an incoming serial data signal DATA is received at sampler 40 from another module using a data path 26. Sampler 40 receives a multiphase clock signal on path 36. The multiphase clock signal may be generated locally (e.g., in the same module 24 in which it is used) or multiple modules may share a multiphase clock signal. The multiphase clock signal may have any suitable number of phases. In the example of FIG. 3, the multiphase clock has five phases, so path 36 contains five separate clock lines. The five phases of the multiphase clock are labeled P1, P2, P3, P4, and P5, respectively. Each of the five multiphase clock signals [P1 ... P5] is shifted by 72° (one fifth of a clock period) with respect to the other, as shown in the upper five traces of FIG. 7.

Sampler 40 uses the multiphase clock signal to generate a corresponding set of sampled data signals [S1 ... S5]. Clock phase P1 is used to sample data signal DATA and results in sampled data signal S1. Similarly, phases P2-P5 are used to produce respective sampled data signals S2-S5. There is a different phase offset between the incoming data signal DATA and each of the multiphase clock signals.

The sampler 40 may capture data using edge-triggered flip-flops. With this type of arrangement, the sampled data will be noisy whenever the sampling clock phases are close to the edge of the signal DATA. Optimum data sampling occurs when the edge of a clock is aligned with the center of the incoming data pulses. By analyzing the sampled data signals S1-S5, the control circuitry 68 can determine which of the multiple phases of the multiphase clock represents the optimum clock phase to use to sample the incoming data. When the optimum clock phase is used, the sampled data will contain a minimum number of errors.

Control circuitry 68 produces a control signal that indicates which of the phases of the clock signal is to be used in receiving the incoming data. This control signal is sometimes referred to as a phase pointer signal. As shown in FIG. 3, the phase pointer signal, which is represented by a vector PHASE POINTER=[a, b, c, d, e], is stored in a shift register 62. The number of individual register elements in register 62 matches the number of phases in the multiphase clock and the number of elements in the PHASE POINTER vector. If, for example, there are five separate phases in the multiphase clock signal, register 62 contains five registers, each of which stores a value of one of the phase pointer elements.

With this type of arrangement, a first register in shift register 62 is used to store the value of a, a second register in shift register 62 stores the value of b, a third register stores c, and fourth and fifth registers store d and e, respectively. The values of four of the phase pointer vector elements are zero. The value of the remaining phase pointer vector element, which represents the state of the phase pointer, is equal to one. A typical state for the vector PHASE POINTER is (0, 0, 1, 0, 0).

The signal PHASE POINTER is fed back to the control circuitry 68 using path 64. The signal PHASE POINTER is also applied to the control input of multiplexer 44 using path 66. Multiplexer 44 receives the sampled data signals S1-S5 from sampler 40. The state of PHASE POINTER determines which of the sampled data signals S1-S5 is passed from paths 42 to path 46 via multiplexer 44. For example, if PHASE POINTER is (1, 0, 0, 0, 0), the first of the five sampled data lines 42 at the inputs to multiplexer 44 will be connected to the output of multiplexer 44. In this situation, sampled data signal S1 will be routed from path 42 to path 46. As another example, if PHASE POINTER is (0, 1, 0, 0, 0), the second sampled data signal (S2) will be passed to the multiplexer output.

On line 46, the selected sampled data (e.g., signal S1 or S2) is referred to as the signal RECOVERED DATA, as shown in FIG. 3. Deserializer 30 receives the RECOVERED DATA signal from path 46 and passes this signal to deserializer 30. Deserializer 30 converts the serial RECOVERED DATA signal to parallel data on lines 38. The parallel data on lines 38 is used by circuitry within the module 24 that has received the incoming data.

When appropriate, the control circuitry 68 updates the value of PHASE POINTER to ensure that incoming data is received using an optimal clock phase. The shift register 62 can be controlled using shift right signal SR and shift left signal SL. If, for example, the signal SR is high (e.g., a logic one) and signal SR is low (a logic zero), the location of the logic one in the registers of shift register 62 will be shifted to the right. As a result, a PHASE POINTER vector in the shift register that has a value of (0, 0, 1, 0, 0) will be shifted to a value of (0, 0, 0, 1, 0) (as an example). If, on the other hand, the value of SR is low and the value of SL is high, the position of the PHASE POINTER will be shifted to the left. When both SR and SL are low, the current value of the PHASE POINTER vector is left unchanged.

Control circuitry 68 includes a phase detector 50 and shift decision circuit 56. The phase detector 50 receives sampled data signals S1-S5 on signal path 48 (e.g., a five-line parallel signal bus). Phase detector 50 also receives a fed-back version of the current PHASE POINTER signal from shift register 62 on feedback path 64. By analyzing the sampled data signals S1-S5 and the current state of PHASE POINTER, the phase detector 50 can generate right and left shift register control signals R and L on respective lines 52 and 54 to control the PHASE POINTER. The shift decision circuitry 56 generates the signals SR and SL for shift register 62 based on the R and L control signals. The shift decision circuitry 56 averages or otherwise filters the signals R and L, which helps ensure that circuit 32 will exhibit good jitter tolerance. The R and L control signals are provided to shift decision circuit 56 using lines 52 and 54, respectively. The shift decision circuit 56 generates corresponding filtered shift register control signals SR and SL on lines 60 and 58, respectively.

Figure 4:
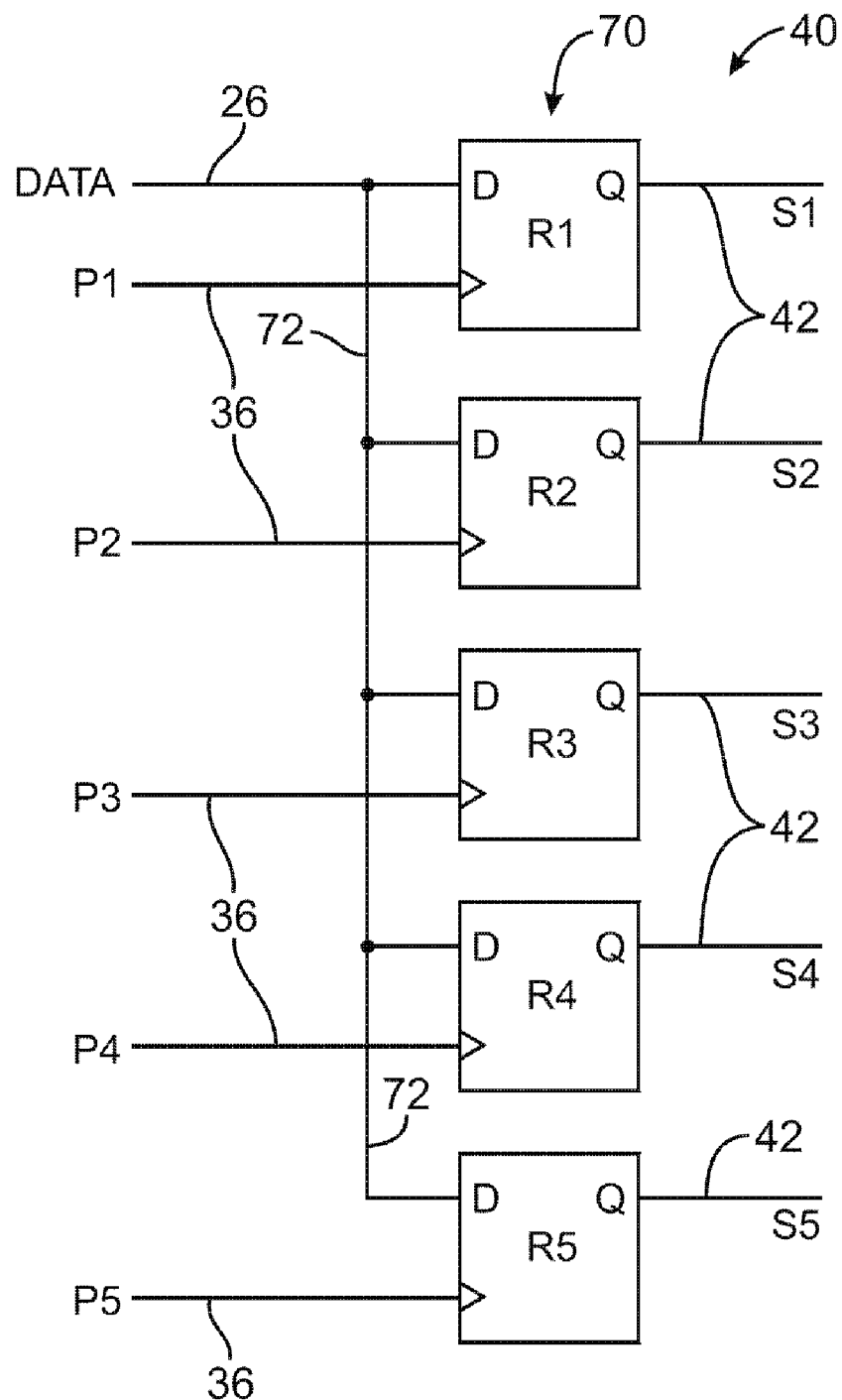
FIG. 4 is a circuit diagram of an illustrative data sampling circuit that may be used in a data recovery circuit of the type shown in FIG. 3 in accordance with the present invention.

FIG. 4 shows an illustrative circuit that may be used for sampler 40 of FIG. 3. As shown in FIG. 4, data may be provided to sampler 40 on a data path 26. The incoming data signal DATA may be distributed to registers 70 (e.g., D-Q flip-flops) using distribution path 72. Each register is clocked using a separate one of the clock phases. Register R1 is clocked using clock phase P1, register R2 is clocked using clock phase P2, and clock phase P3 is used to clock register R3. Registers R4 and R5 are clocked using clock signals P4 and P5, respectively.

As registers 70 are clocked with their respective clock signals, the data signal DATA on line 26 is sampled. The sampled data signals S1-S5 are provided on output lines 42 at the outputs of respective registers 70. For example, when clock phase P1 is used to sample DATA, the sampled data signal S1 on the output 42 of register R1 is produced. Similarly, sampled data signals S2-S5 are produced at the outputs of registers R2-R5 using respective clock phases P2-P5.

The relative timing between each of the clock phases and the data signal is different. Samples that are taken with a clock phase that is too near an edge of the data signal are not predictable, but at least one of the signals produces an optimum result. Optimum data sampling typically results when the data is sampled at a point that is midway between its rising and falling edges. When a clock phase that has its rising edge aligned with the midpoint of the data signal DATA is used to sample the data, an optimum predictable sampled data signal is produced. Due to drift between the clock signal phases and the data signal, the optimum clock phase will generally change as a function of time. Control circuitry 68 of FIG. 3 computes the optimum clock phase for data recovery and updates the optimum clock phase as a function of time, using circuitry such as phase detector 40 and shift decision circuit 56 of FIG. 3.

Figure 5:
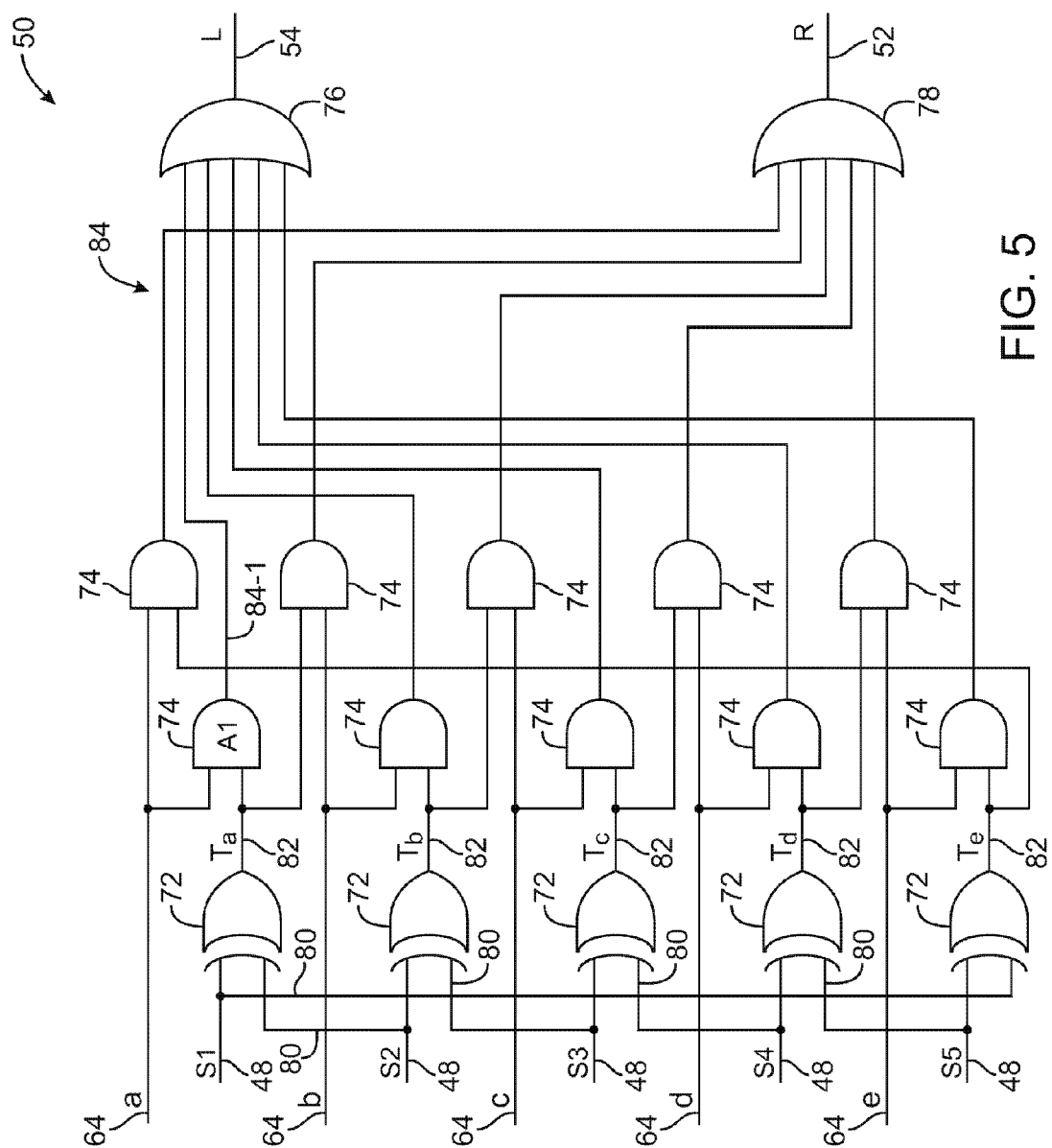
FIG. 5 is a circuit diagram of illustrative phase detector circuitry that may be used in a data recovery circuit of the type shown in FIG. 3 in accordance with the present invention.

Phase detector circuitry 50 that may be used in a data recovery circuit of the type shown in FIG. 3 is shown in FIG. 5. The phase detector circuitry 50 of FIG. 5 is merely illustrative. In general, any suitable phase detector circuitry may be used if desired. In the example of FIG. 5, phase detector circuitry 50 includes five input lines 64, each of which receives a respective element of the five-element PHASE POINTER vector (i.e., the elements a, b, c, d, e) from shift register 62. Sampled data signals S1-S5 are provided to exclusive OR gates 72 via paths 80.

Exclusive OR gates 72 analyze the sampled data signals S1-S5 to identify the location of the edge of the signal DATA. Phase detector circuit 50 can deduce the location of the midpoint of the data signal from the location of the data signal edge and can therefore identify the optimum clock phase to use in recovering the data signal. The outputs of the exclusive OR gates 72 are data edge location signals Ta, Tb, Tc, Td, and Te on output lines 82. Signals Ta, Tb, Tc, Td, and Te indicate the location of the data edge.

For example, if data samples S1, S2, S3, S4, and S5 have the values 1, 1, 1, 0, and 0, respectively, signals Ta, Tb, Tc, Td, and Te will have the values 0, 0, 1, 0, 0, respectively. The signal Tc is high, because the transition between the data value of 1 and the data value of 0 occurs between data sample S3 and S4. Because the sampled data is high for samples S1, S2, and S3 and is low for samples S4 and S5, the edge of the data signal lies at a time between the rising edge of clock phase P3 and the rising edge of clock phase P4. This is reflected by the high value of Tc.

If, as another example, the data samples S1, S2, S3, S4, and S5 were to have the values 1, 1, 0, 0, and 0, respectively, signals Ta, Tb, Tc, Td, and Te will have the values 0, 1, 0, 0, 0, respectively. In this scenario, the signal Tb is high, because the transition between the data value of 1 and the data value of 0 occurs between data sample S2 and S3. The sampled data is high for samples S1 and S2 and is low for samples S3, S4, and S5, indicating that the edge of the data signal lies at a time between the rising edge of clock phase P2 and the rising edge of clock phase P3. The value of Tb is therefore high while the remaining components of the data edge location signal (Ta, Tc, Td, and Te) are low.

Based on knowledge of the location of the data edge, the control circuitry 68 can determine which of the multiple clock phases should be used to sample the incoming data. The optimum clock phase is generally aligned with the midpoint of the signal DATA and is shifted two clock phases with respect to the position of the edge of signal DATA. For example, if the data edge lies between the edges of clock phases P3 and P4, the middle of the signal DATA lies at about the edge of clock phase P1. As a result, optimum results will be obtained by using the clock phase P1 to sample DATA. The resulting sampled data (S1) can be provided to deserializer 30. Control circuitry 68 and multiplexer 44 are used to ensure that the optimum sampled data (S1 in this example) is routed to deserializer 30.

The AND gates 72 receive the edge location signal values Ta-Te and the value of the PHASE POINTER and produce corresponding outputs for OR gates 76 and 78 on lines 84. The OR gate 76 produces the L signal on line 54. The OR gate 78 produces the R signal on line 52.

The signal PHASE POINTER provides phase detector 50 with information on the current clock phase that is being used to recover data. If, for example, the current clock phase is P1 and sampled data S1 is being used as the recovered data, the current value of PHASE POINTER will be equal to (1, 0, 0, 0, 0). If the DATA signal drifts, the values of S1-S5 will change. Through the operation of exclusive OR gates 72, the values of Ta-Te will be updated to reflect the new location of the edge of the data signal. The AND gates 72 and OR gates 76 and 78 use the most recent information on the location of the data signal edge (Ta-Te) and information on the current setting for multiplexer 44 (PHASE POINTER) to determine whether the value of PHASE POINTER needs to be changed. If the sampled data signal that is being used for RECOVERED DATA needs to be changed to reflect drift in the position of the edge of DATA, the AND gates 72 and OR gates 76 and 78 will generate suitable R and L signals on outputs 54 and 52.

Figure 6:
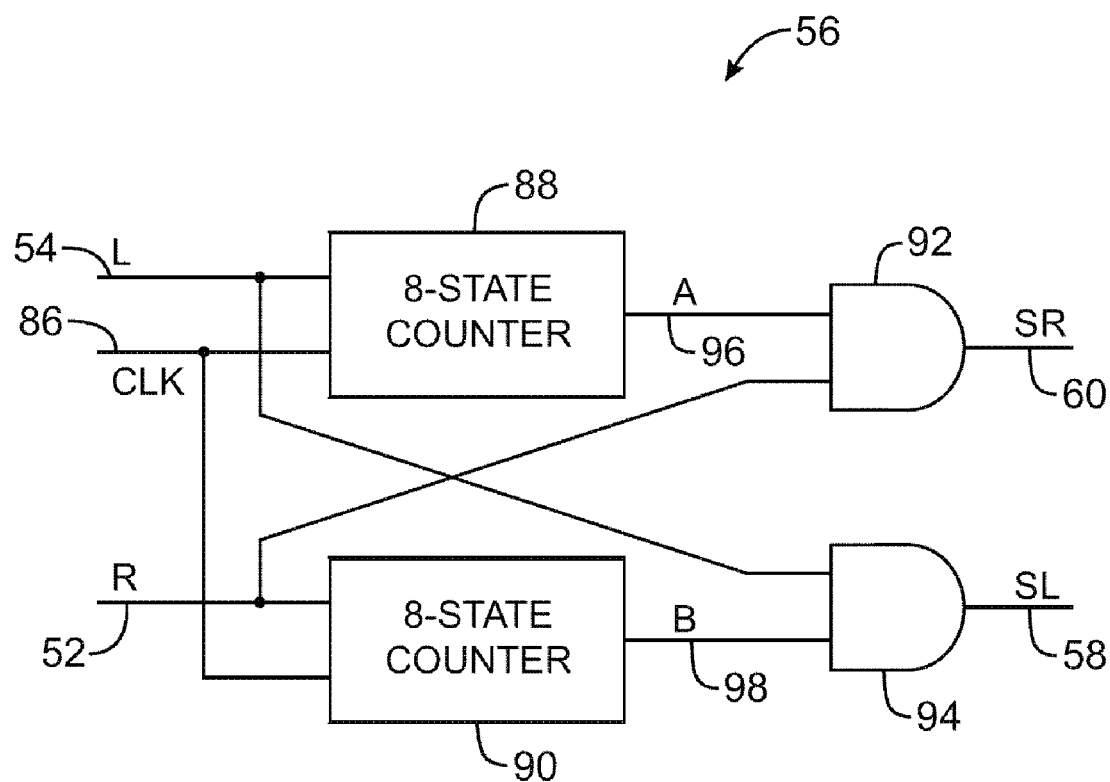
FIG. 6 is an illustrative shift decision circuit that may be used in a data recovery circuit of the type shown in FIG. 3 in accordance with the present invention.

The signals R and L on lines 54 and 52 change rapidly as the position of the date edge shifts in real time. To increase jitter tolerance, it may be desirable to introduce a low-pass filter into the control algorithm. FIG. 6 shows an illustrative shift decision circuit 56 that may be used to implement a low-pass filter in the control circuitry 68. The low-pass filtering provided by circuit 56 helps to ensure that the response of the control circuit 68 to sudden shifts in the position of the data edge is dampened.

The inputs to shift decision circuit 56 of FIG. 6 are unfiltered left and right control signals L and R (provided on input lines 54 and 52, respectively) and clock signal CLK (provided on clock input line 86). The outputs of circuit 56 are the filtered control signals SR and SL on lines 60 and 58. Unfiltered left control signal L and clock signals CLK are provided to the inputs of 8-state counter 88. The 8-state counter 88 provides a corresponding output signal A on output line 96. Unfiltered shift right control signal R and clock signal CLK are provided to the inputs of 8-state counter 90. The 8-state counter 90 produces a corresponding output signal B on line 98. The AND gate 92 receives the signal A and the unfiltered shift right control signal R at its inputs and produces the filtered shift right control signal SR at output 60. The AND gate 94 receives the signal B and the unfiltered shift left signal L at its inputs and produces a corresponding filtered shift left signal SL.

The 8-state counters 88 and 90 are countdown counters. When initialized, the count value of these counters is equal to 111 (8). During counting operations, the count value is decremented by one during each clock cycle. So long as the count value is greater than 0, the outputs of outputs of the 8-state counters 88 and 90 are low (a logical zero). When the count of 8-state counter 88 reaches 000 (0), the output A goes high. The output B goes high when counter 90 reaches a count value of 0.

The shift decision circuit 56 implements a low-pass filter algorithm. Whenever the signal L or the signal R goes high, the count of its associated counter is set to 111. With each subsequent clock cycle, the count of the clock is decremented by one. If the counter value associated with a given counter reaches 0, the output of that counter goes high.

Whenever it is determined that the data signal DATA has shifted sufficiently to warrant a corresponding change in the setting of multiplexer 44, phase detector 50 generates a corresponding error signal in the form of an R or L signal. If the one stored in the shift register 62 is to be shifted to the right, the signal R is taken high. If the one stored in the shift register 62 is to be shifted to the left, the signal L is taken high. Circuit 56 filters the unfiltered R and L signals, so that updates to the setting of multiplexer 44 are not made too frequently.

Consider, as an example, a situation in which the signal L goes high. When L goes high, the L input to AND gate 94 goes high. The B output of 8-state counter 90 will be high, provided that the R signal has been low for eight clock cycles. In this situation, both inputs to AND gate 94 will be high and the filtered shift left signal SL at output 58 of AND gate 94 will go high. Note, however, that the SL signal will only go high if the high L signal has not been contradicted by a high R signal for 8 clock cycles. Because any activity on R within these 8 clock cycles will prevent SL from going high, the circuit 56 acts as a low-pass filter. Rapid fluctuations on the R and L signals on the inputs of circuit 56 will prevent the outputs SL and SR from going high. As a result of this averaging effect, the decision circuit 56 serves to improve the jitter tolerance of data recovery circuit 32.

Figure 7:
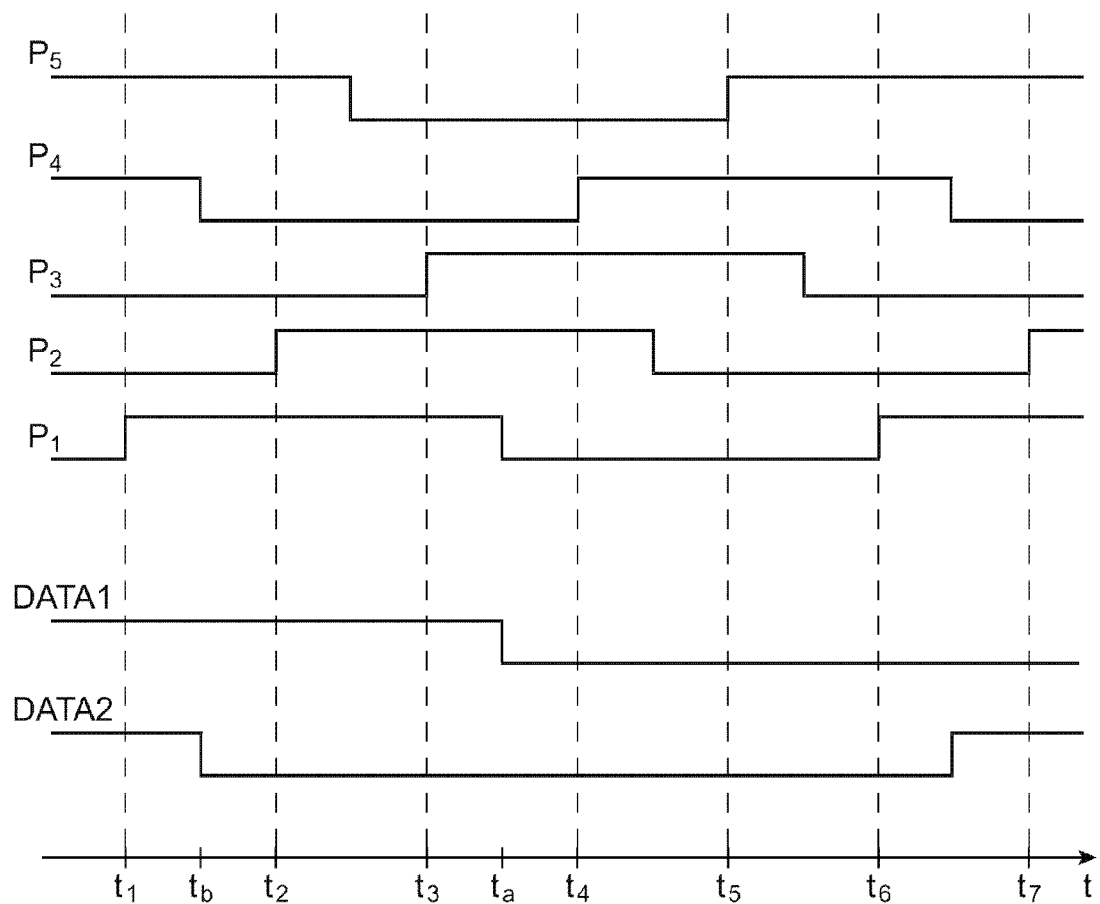
FIG. 7 is a diagram showing clock phases in an illustrative multiphase clock and showing illustrative data signals in accordance with the present invention.

The operation of data recovery circuit 32 can be further understood with reference to the examples of FIG. 7. The lowermost two traces of FIG. 7 correspond to two illustrative conditions for the data signal DATA that is being received at the input to sampler 40 of FIG. 3. The traces are labeled DATA1 and DATA2. The trace labeled DATA1 has a falling edge at time $t_a$. The trace labeled DATA2 has a falling edge at time $t_b$.

Consider the situation in which the incoming data signal DATA has the waveform shows as DATA1 in FIG. 7 and the PHASE POINTER signal is (1, 0, 0, 0, 0). In this configuration, multiplexer 44 is passing the sampled data signal S1 to its output. Sampler 40 uses clock phases P1-P5 to sample the data. The locations of the rising edges of the clock phases P1-P5 are shown in the five uppermost traces of FIG. 7. When these clock phases are used to sample DATA1, the value of the samples S1-S5 from the outputs of sampling registers R1-R5 in sampler 40 of FIG. 4 will be (1, 1, 1, 0, 0). Phase detector circuit 50 of FIG. 5 receives the PHASE POINTER signal (1, 0, 0, 0, 0) and the samples (1, 1, 1, 0, 0) at inputs 64 and 52 and produces corresponding edge location signals Ta, Tb, Tc, Td, and Te (0, 0, 1, 0, 0) at outputs 82. In this state, each of the AND gates 74 has at least one low input, so the signals on lines 84 and the R and L outputs of OR gates 78 and 76 are low. The R and L signals are provided as inputs to circuit 56 of FIG. 3. So long as no changes occur in eight cycles of CLK, the corresponding filtered control signals SR and SL that are produced at the output of circuit 56 of FIG. 6 will also be low. Because SR and SL are low, the output of shift register 62 is not changed and the value of PHASE POINTER remains the same.

Assume, due to environmental changes in the circuitry 22, that the signal DATA experiences signal drift. This drift causes the signal DATA to shift in relationship to the phase clocks P1-P5. In particular, the DATA signal in the present example moves from the position indicated by DATA1 to the position indicated by DATA2. In this situation, the data signal has shifted significantly, so the clock phase P1 will no longer be the optimal clock phase to use in capturing the data signal. As a result, the PHASE POINTER will need to be updated.

Because DATA2 transitions from high to low at a time $t_b$ that lies between the rising edge of clock phase P1 (time $t_1$) and the rising edge of clock phase P2 (time $t_2$), the samples S1, S2, S3, S4, and S5 that are produced at the output of sampler 40 will be 1, 0, 0, 0, and 0, respectively. At the outputs 82 of exclusive OR gates 72, the signals Ta, Tb, Tc, Td, and Te will be 1, 0, 0, 0, and 0, respectively (indicating that DATA2 falls from high to low between $t_1$ and $t_2$). The value of PHASE POINTER (a, b, c, d, e) is equal to (1, 0, 0, 0, 0), as described in connection with the sampling of DATA1. Because the value of PHASE POINTER element "a" is high and because Ta is high, AND gate A1 of FIG. 5 has two high inputs. The output of AND gate A1 is therefore high, which takes L high. This high signal is provided to the input of OR gate 76 via line 84-1, which takes the output L of OR gate 76 high.

As this example demonstrates, when the signal DATA shifts by two clock phases (plus or minus), a corresponding shift register control signal (R or L) is taken high. Shifts of less than plus or minus two clock phases (i.e., shifts of only plus or minus one clock phase or shifts of no clock phases) do not result in a non-zero shift register control signal. Rather, when there is a data signal shift of less than or equal to one clock phase in magnitude, the values of R and L remain at zero. This control algorithm, which is implemented by circuit 50 of FIG. 5, increases jitter tolerance, because the sampling position represented by the setting of multiplexer 44 is not updated unless there is a substantial (e.g., 2 or more clock phase) phase shift in the data signal.

In the present example, there are five clock phases and the shift control signals R and L are active only upon changes of two or more clock phases. This is merely illustrative. Any suitable number of clock phases may be used by sampler 40 and the threshold for making PHASE POINTER updates may be set at any suitable level. As one example, there may be ten clock phases in use and the threshold for shifting the contents of shift register 62 may be set to four clock phases by proper configuration of the phase detector circuitry. As another example, there may be 20 clock phases in use and the threshold for shifting the contents of the shift register 62 may be set to eight clock phases. The threshold error for shifting will typically be at least two (two, four, and eight are all greater than or equal to two in these examples).

Figure 8:
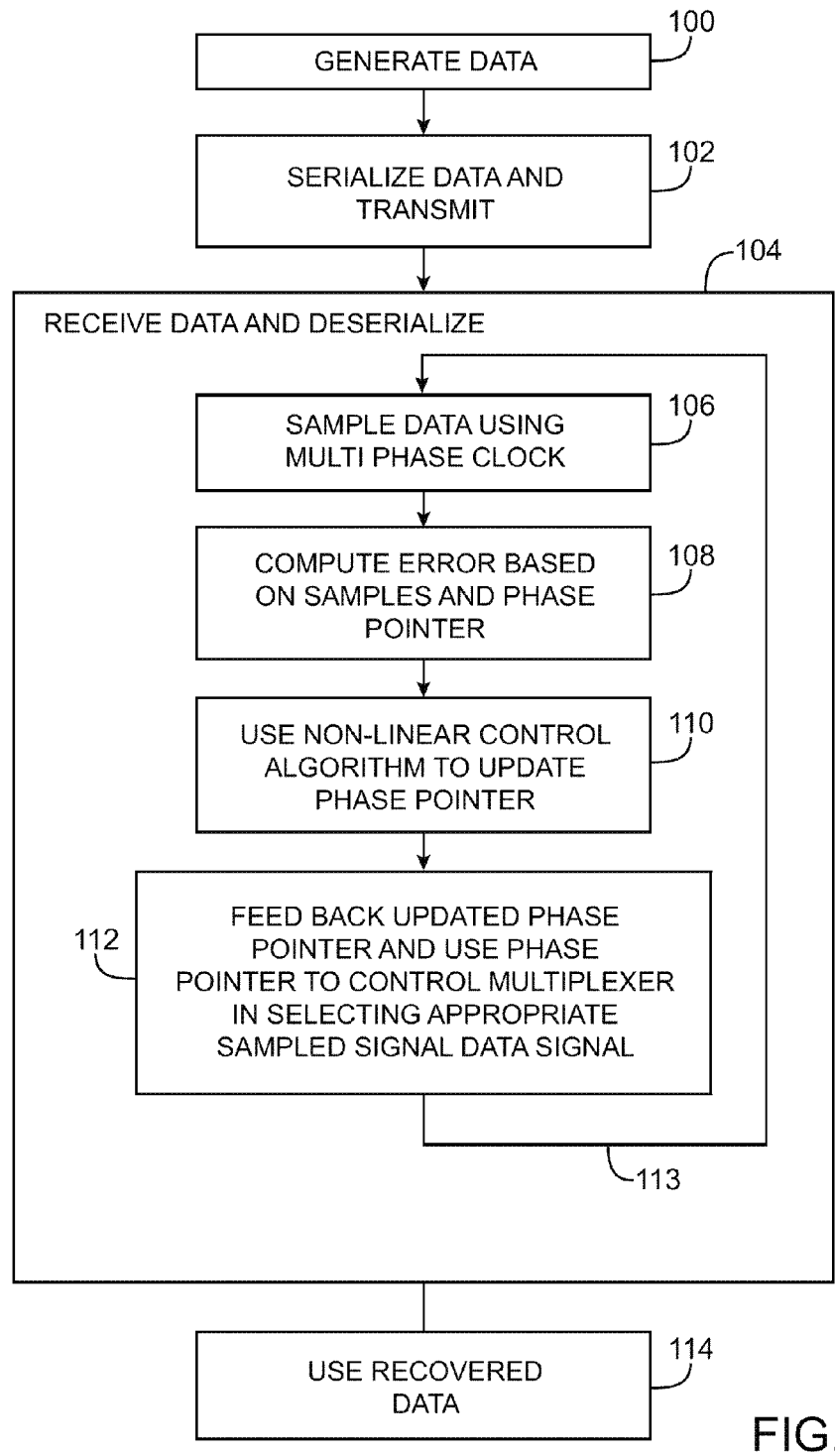
FIG. 8 is a flow chart of illustrative operations involved in transmitting and receiving data over serial links using a data recovery circuit that implements a non-linear control algorithm in accordance with the present invention.

Illustrative steps involved in using this type of control algorithm during the data recovery operations of data capture circuit 32 of FIG. 3 are shown in FIG. 8.

At step 100, programmable logic or other circuitry within one of the modules 24 of circuitry 22 (FIG. 2) generates data to be transmitted to another module 24.

At step 102, the transmitting module 24 uses a serializer 28 (FIG. 2) to serialize and transmit the data over a serial communications path 26.

At step 104, data recovery circuitry such as data recovery circuit 32 in the receiver of a receiving module 24 recovers the incoming serial data.

At step 114, the recovered data is deserialized using a deserializer 30 and is routed to parallel signal lines such as lines 38 of FIG. 3 for use by the circuitry of the receiving module.

Multiple substeps are involved in the operations of step 104.

During step 106, sampler 40 samples the incoming data using a multiphase clock. In the example of FIG. 3, a five-phase multiphase clock having signals P1, P2, P3, P4, and P5 is used to sample incoming data at various different sample points. Because five samples are taken per data clock cycle, this approach is sometimes referred to as five-times oversampling.

At step 108, the data recovery circuit 32 uses control circuitry 68 to determine how far shifted the data signal DATA is shifted with respect to the clock phase and sampled data stream that are currently being used. The deviation between the optimum clock phase that is to be used to sample the incoming data and the clock phase setting that is already in use (i.e., the current value of PHASE POINTER and the current setting of multiplexer 44) is sometimes referred to as a clock phase shift error signal.

At step 110, the control circuitry 68 uses a non-linear control algorithm to update PHASE POINTER and thereby eliminate the deviation between the desired optimum sampling point and the current sampling point. The updated value of PHASE POINTER is fed back to phase detector 50 using path 64 (FIG. 3) (step 112). The updated PHASE POINTER value is also applied to the control terminal of multiplexer 44 via path 66 (FIG. 3). As indicated by line 113, the data recovery process may operate continuously.

During step 104, the control circuitry 68 computes the phase error and determines which corrections need to be made to the value of PHASE POINTER using a non-linear control algorithm. The non-linear control algorithm preferably includes a time delay (averaging) component that serves as a low-pass filter, as described in connection with the discussion of FIG. 6. With the non-linear control algorithm, corrections to the current value of PHASE POINTER are preferably not made unless the error exceeds a predetermined threshold amount. In the example described in connection with FIGS. 3 and 6, the multiphase clock included five clock phases and the error threshold was set at two clock phase deviations from the correct alignment point. With this type of arrangement, PHASE POINTER updates are not made by the control circuitry 68 and its non-linear control algorithm unless the computed error is at least two clock phases. Errors of one clock phase (or errors of zero when the sampling point is correctly aligned) fall below the two clock phase threshold and do not result in any change to PHASE POINTER.

Although described in connection with an example in which the multiphase clock has five separate clock phase signals and the error threshold equals two clock phases, and changes to the PHASE POINTER are low-pass filtered using counters or other such circuitry in a shift decision circuit, the data recovery circuit may use any suitable non-linear control algorithm arrangement. The use of the non-linear control algorithm described in connection with control circuitry 68 of FIG. 3 is merely illustrative.

Figure 9:
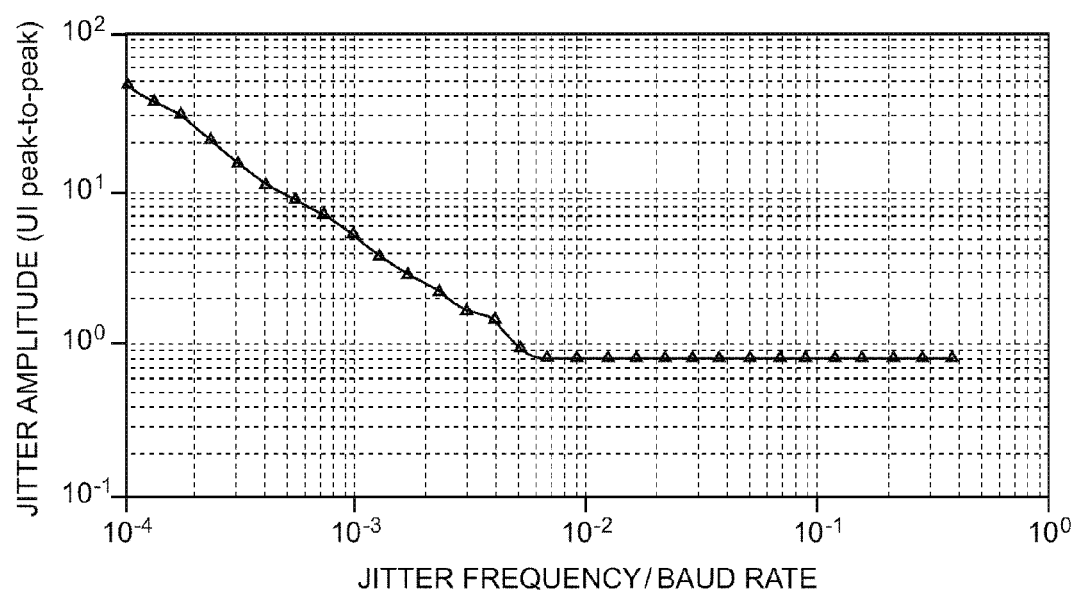
FIG. 9 is a graph of a jitter tolerance simulation for a data recovery control algorithm in accordance with the present invention.

The non-linear control algorithm that is implemented by the control circuitry 68 allows incoming data to be received with zero delay, while exhibiting good jitter tolerance. A jitter tolerance simulation has been performed for the non-linear control algorithm described in connection with FIG. 3. The results of this simulation are plotted in the graph of FIG. 9. The jitter tolerance simulation of FIG. 9 was performed using 20,000 bits of PRBS7 data (approximately 100,000 samples). The update period was set to eight symbol periods, consistent with the use of 8-state counters 88 and 90 in circuit 56 of FIG. 6. The curve of FIG. 9 exhibits a relatively high value of jitter tolerance (about 0.8 unit intervals) starting at a relatively high jitter-frequency/baud-rate value of $7 \times 10^{-3}$, indicating that the control algorithm implemented by control circuitry 68 exhibits good high-frequency jitter tolerance.

The serial interconnect scheme of the present invention can exhibit a bandwidth that is comparable to parallel clocking schemes. Consider, as an example, a parallel clocking arrangement using a 500 MHz clock and a 16-bit parallel bus. In this situation, the bandwidth of the bus would be about 16*0.5 GHz=8 Gbps. In comparison, a typical serial link 26 may have a bandwidth of about 10 Gbps. Because data can be transmitted over serial links 26 in nearly the same clock cycle that it is generated, there is essentially no latency penalty imposed on serially transmitted data. At the same time, the amount of hardware resources that are consumed by interconnects on device 10 can be substantially reduced by replacing numerous parallel interconnects with relatively fewer serial interconnects.

The data recovery circuit 32 (e.g., circuitry of the type described in connection with FIG. 3) may be implemented using hardwired circuitry, programmable logic, or a combination of hardwired circuitry and programmable logic.

Figure 10:
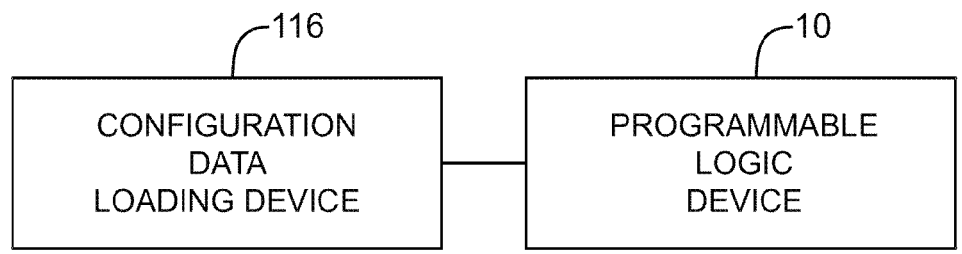
FIG. 10 is a diagram showing how configuration data for a programmable logic device may be loaded into the programmable logic device from a configuration data loading device in accordance with the present invention.

Programmable logic device integrated circuit 10 may be loaded with configuration data from a configuration data loading device 116, as shown in FIG. 10. Configuration data loading device 116 may be any suitable equipment for loading configuration data into programmable logic device 10. In a testing environment, device 116 may be a tester that uses a test fixture to load configuration data into device 10. In a system environment, device 116 may be a configuration device integrated circuit that is located on the same system board as programmable logic device integrated circuit 10 (as an example). During system power-up operations or at other suitable times, configuration data may be loaded from the configuration device into programmable logic device 10 to program device 10 to implement a desired logic design. When it is desired to implement some or all of data recovery circuit 32 from programmable logic, part of the configuration data that is loaded into programmable logic device 10 configures programmable logic 18 (FIG. 1) to implement the data recovery circuit 32 (or part of circuit 32).

Figure 11:
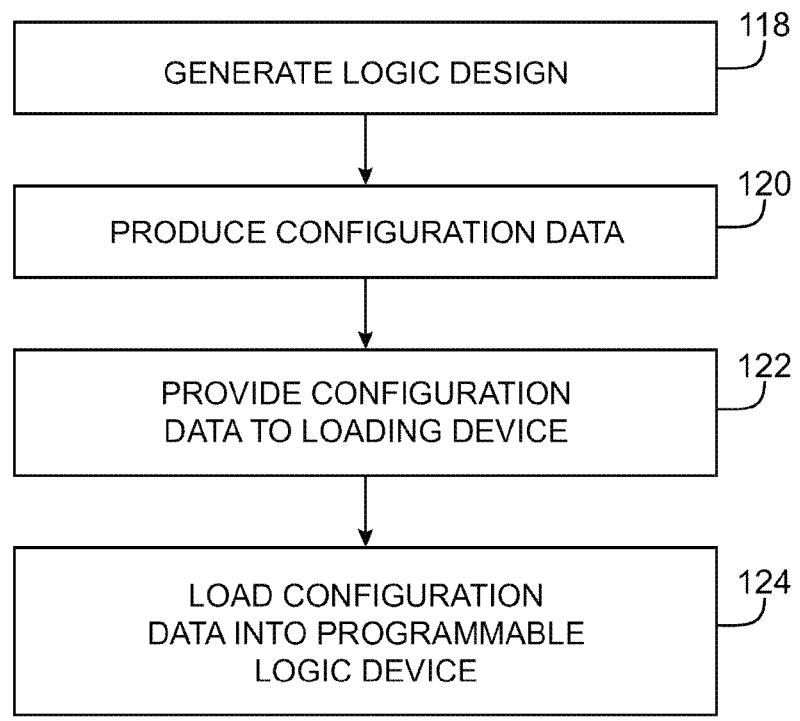
FIG. 11 is a flow chart of illustrative steps involved in configuring a programmable logic device integrated circuit to implement a data recovery circuit from programmable logic resources in accordance with the present invention.

Illustrative steps involved in configuring programmable logic device 10 to perform the functions of data recovery circuit 32 are shown in FIG. 11.

At step 118, a logic designer uses computer-aided design (CAD) tools to generate a desired logic design for programmable logic device 10. The logic design may be entered using design entry tools. Logic synthesis tools and placement and routing tools may be used to determine how to implement the logic design from the hardwired and programmable logic resources available on a given programmable logic device 10.

At step 120, the CAD tools generate configuration data from the logic designer's logic design specifications.

At step 122, the configuration data that has been generated is provided to the configuration data loading device 116. For example, the configuration data may be stored in non-volatile memory on a system board or may be stored in non-volatile memory in a configuration device integrated circuit.

At step 124, the configuration data is loaded from configuration data loading device 116 (FIG. 10) into programmable logic device integrated circuit 10. Once loaded, the configuration data implements all or part of data recovery circuit 32 from programmable logic 18. Device 10 and its data recovery circuit 32 may then be used in a system.

The foregoing is merely illustrative of the principles of this invention and various modifications can be made by those skilled in the art without departing from the scope and spirit of the invention.

What is claimed is:

1. A method for receiving serial interconnect data comprising:
    sampling a serial interconnect data signal using multiple clock phases to produce multiple sampled data signals;
    with a multiplexer, selecting an optimum one of the sampled data signals to form a recovered data signal;
    controlling the multiplexer with a phase pointer signal that indicates which of the sampled data signals is to be selected;
    analyzing the sampled data to determine how much clock phase shift error exists between a current value of the phase pointer signal and an optimum value of the phase pointer signal; and
    updating the phase pointer only if the clock phase shift error is equal to a threshold value of at least two clock phases.

2. The method defined in claim 1 further comprising:
    at a first circuit block on an integrated circuit, serializing data to produce the serial interconnect data signal;
    conveying the serial interconnect data signal from the first circuit block to a second circuit block over a serial interconnect communications path, wherein sampling the serial interconnect data signal comprises sampling the serial interconnect data signal with a sampler in the second circuit block.

3. The method defined in claim 1 further comprising:
    at a first integrated circuit on a circuit board, serializing data to produce the serial interconnect data signal;
    conveying the serial interconnect data signal from the first integrated circuit to a second integrated circuit over a serial communications path, wherein sampling the serial interconnect data signal comprises sampling the serial interconnect data signal with a sampler in the second integrated circuit.

4. The method defined in claim 1 wherein sampling the serial interconnect data signal comprises sampling the serial interconnect data signal with a data sampler that receives a five-phase clock signal.

5. The method defined in claim 1 wherein analyzing the sampled data comprises determining the clock phase shift error based on analysis of the multiple data samples and the current value of the phase pointer signal.

6. The method defined in claim 1 further comprising:
    maintaining the current value of the phase pointer signal in a shift register, wherein updating the phase pointer only if the clock phase shift error is equal to the threshold value comprises generating shift right and shift left control signals for the shift register.

7. The method defined in claim 1 further comprising:
    maintaining the current value of the phase pointer signal in a shift register, wherein updating the phase pointer only if the clock phase shift error is equal to the threshold value comprises generating unfiltered shift right and shift left control signals with a phase detector, filtering the shift right and shift left control signals with a shift decision circuit, and applying the filtered shift right and filtered shift left control signals to the shift register.

8. The method defined in claim 1 further comprising:
    maintaining the current value of the phase pointer signal in a shift register, wherein updating the phase pointer only if the clock phase shift error is equal to the threshold value comprises generating unfiltered shift right and shift left control signals with a phase detector, filtering the shift right and shift left control signals with a shift decision circuit, and applying the filtered shift right and filtered shift left control signals to the shift register;
    providing the phase pointer signal from the shift register to the multiplexer at a control signal input; and
    feeding back the phase pointer signal to the phase detector from the shift register.

9. The method defined in claim 1 further comprising:
    maintaining the current value of the phase pointer signal in a shift register, wherein updating the phase pointer only if the clock phase shift error is equal to the threshold value comprises generating unfiltered shift right and shift left control signals with a phase detector, filtering the shift right and shift left control signals with a shift decision circuit, and applying the filtered shift right and filtered shift left control signals to the shift register and wherein filtering the shift right and shift left control signals with the shift decision circuit comprises filtering the shift right and shift left control signals with two counters in the shift decision circuit;
    providing the phase pointer signal from the shift register to the multiplexer at a control signal input; and
    feeding back the phase pointer signal to the phase detector from the shift register.

10. A method for conveying data from a first circuit module on an integrated circuit to a second circuit module on the same integrated circuit over a serial interconnect path on the integrated circuit, comprising:
    receiving serial data from the serial interconnect path using a data sampler in the second circuit module;
    with the data sampler, sampling the received serial data using a multiphase clock to produce multiple sampled data signals;
    with a multiplexer, selecting one of the sampled data signals to serve as a recovered data signal for the second circuit module;
    controlling the multiplexer with a phase pointer signal that indicates which of the sampled data signals is selected;
    determining how much clock phase shift error exists between a current value of the phase pointer signal and an optimum value of the phase pointer signal; and
    updating the current value of the phase pointer based on the clock phase shift error, wherein updating the current value of the phase pointer based on the clock phase shift error comprises comparing the clock phase shift error to a threshold error and updating the current value of the phase pointer only when the clock phase shift error is equal to at least the threshold error, wherein the threshold error equals two clock phases of the multiphase clock.

11. The method defined in claim 10 wherein the first circuit module comprises programmable logic, the method further comprising:
  generating data in the first circuit module using the programmable logic; and
  serializing the data generated by the programmable logic to form the serial data.

12. The method defined in claim 10 wherein the integrated circuit comprises a programmable logic device, wherein the first circuit module and the second circuit module comprise programmable logic, wherein the first circuit module comprises a serializer, and wherein the second circuit module comprises a deserializer, the method further comprising:
  generating data in the first circuit module using the programmable logic;
  with the serializer, serializing the data generated by the programmable logic to form the serial data; and
  with the deserializer, deserializing the recovered data signal.

13. A method for conveying data from a first circuit module on an integrated circuit to a second circuit module on the same integrated circuit over a serial interconnect path on the integrated circuit, comprising:
  receiving serial data from the serial interconnect path using a data sampler in the second circuit module;
  with the data sampler, sampling the received serial data using a multiphase clock to produce multiple sampled data signals;
  with a multiplexer, selecting one of the sampled data signals to serve as a recovered data signal for the second circuit module;
  controlling the multiplexer with a phase pointer signal that indicates which of the sampled data signals is selected;
  determining how much clock phase shift error exists between a current value of the phase pointer signal and an optimum value of the phase pointer signal;
  updating the current value of the phase pointer based on the clock phase shift error; and
  maintaining the phase pointer in a shift register, wherein updating the current value of the phase pointer based on the clock phase shift error comprises comparing the clock phase shift error to a threshold error and updating the current value of the phase pointer only when the clock phase shift error equals at least the threshold error, wherein updating the current value of the phase pointer comprises applying shift control signals to the shift register.

14. A method for conveying data from a first circuit module on an integrated circuit to a second circuit module on the same integrated circuit over a serial interconnect path on the integrated circuit, comprising:
  receiving serial data from the serial interconnect path using a data sampler in the second circuit module;
  with the data sampler, sampling the received serial data using a multiphase clock to produce multiple sampled data signals;
  with a multiplexer, selecting one of the sampled data signals to serve as a recovered data signal for the second circuit module;
  controlling the multiplexer with a phase pointer signal that indicates which of the sampled data signals is selected;
  determining how much clock phase shift error exists between a current value of the phase pointer signal and an optimum value of the phase pointer signal;
  updating the current value of the phase pointer based on the clock phase shift error;
  maintaining the phase pointer in a shift register; and
  processing the sampled data signals and the phase pointer with control circuitry, wherein updating the current value of the phase pointer based on the clock phase shift error comprises comparing the clock phase shift error to a threshold error with the control circuitry and updating the current value of the phase pointer only when the clock phase shift error equals at least the threshold error, wherein updating the current value of the phase pointer comprises applying shift control signals to the shift register with the control circuitry.

15. Circuitry, comprising:
  a data sampler that receives serial data from a serial interconnect path, that receives multiple clock phases that are used to sample the serial data to produce multiple sampled data signals, and an output at which each of the multiple sampled data signals is provided;
  a multiplexer having multiple sample data inputs each of which receives a respective one of the multiple sampled data signals from the data sampler, having a control input to which a phase pointer signal is provided, and having an output at which a selected one of the sampled data signals is provided as a recovered data signal in response to the phase pointer signal; and
  control circuitry that receives the sampled data signals from the data sampler and that uses the phase pointer signal and the received sampled data signals to determine how much clock phase shift error exists between a current value of the phase pointer signal and an optimum value of the phase pointer signal, wherein the control circuitry updates the current value of the phase pointer only when the clock phase shift error is equal to at least a threshold error of at least two clock phases.

16. The circuitry defined in claim 15 wherein the control circuitry comprises a phase detector that receives the sampled data signals, that receives the phase pointer signal, and that produces corresponding right and left shift signals.

17. The circuitry defined in claim 15 wherein the control circuitry comprises:
  a shift register in which the phase pointer signal is maintained; and
  a shift decision circuit that implements a low-pass filter and that applies filtered right and left shift control signals to the shift register.

18. The circuitry defined in claim 15 wherein the control circuitry comprises:
  a shift register in the control circuitry in which the phase pointer signal is maintained;
  a phase detector that receives the sampled data signals, that receives the phase pointer signal from the shift register, and that produces corresponding right and left shift signals; and
  a shift decision circuit containing counter circuitry that implements a low pass filter, wherein the shift decision circuit receives the right and left shift control signals from the phase detector and generates corresponding filtered right and left shift control signals, wherein the filtered right and left shift control signals are provided to the shift register to control the phase pointer signal.

* * * * *